United States Patent [19]
Onda

[11] Patent Number: 5,760,427
[45] Date of Patent: Jun. 2, 1998

[54] HIGH ELECTRON MOBILITY TRANSISTOR WITH AN IMPROVED INTERFACE BETWEEN DONOR AND SCHOTTKY LAYERS

[75] Inventor: Kazuhiko Onda, Tokyo, Japan

[73] Assignee: NEC Corporation, Tokyo, Japan

[21] Appl. No.: 567,160

[22] Filed: Dec. 5, 1995

[30] Foreign Application Priority Data

Dec. 5, 1994 [JP] Japan .................................. 6-300975

[51] Int. Cl.$^6$ ...................... H01L 29/201; H01L 29/812
[52] U.S. Cl. ........................ 257/194; 257/24; 257/284
[58] Field of Search .......................... 257/24, 192, 144, 257/284

[56] References Cited

U.S. PATENT DOCUMENTS

| | | | |
|---|---|---|---|
| 5,313,093 | 5/1994 | Nakagawa | 257/194 |
| 5,548,138 | 8/1996 | Tanimoto et al. | 257/194 |
| 5,548,139 | 8/1996 | Ando | 257/284 |

OTHER PUBLICATIONS

T. Nittono et al., "Non–Alloyed Ohmic Contacts to n–GaAs Using Compositionally Graded $In_xGa_{1-x}As$ Layers", Japanese Journal of Applied Physics, Sep. 1988, vol. 27, No. 9, pp. 1718–1722.

T. Enoki et al., "Delay Time Analysis for 0.4– to 5–um–Gate InAlAs–InGaAs HEMT's", IEEE Electron Device Letters, No. 1990, vol. 11, No. 11, pp. 502–504.

K. Onda et al., "Highly Reliabel InAlAs/InGaAs Heterojunction FETs Fabricated Using Completely Molybdenum–Based Electrode Technology (COMET)", IEEE, pp. 261–264, no date.

*Primary Examiner*—Gene M. Munson
*Attorney, Agent, or Firm*—Young & Thompson

[57] ABSTRACT

The present invention provides a semiconductor multi-layer structure which has a channel layer made of a first compound semiconductor having a first conduction band edge level. The channel layer has a first thickness sufficient for confining a two-dimensional electron gas. The semiconductor multi-layer structure also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The semiconductor multi-layer structure also has a single quantum well layer overlying the donor layer. The quantum well layer is made of a third compound semiconductor having a third conduction band edge level lower than the second-conduction band edge level. The single quantum well layer is sufficiently thin for preventing any formation of a two-dimensional electron gas. The semiconductor multi-layer structure also has a Shottky barrier layer overlying the single quantum well layer. The Schottky barrier layer is made of a fourth compound semiconductor having a fourth conduction band edge level higher than the third conduction band edge level. The Schottky barrier layer is sufficiently thin for allowing electrons to show a tunneling across the Schottky barrier layer. The semiconductor multi-layer structure also has a cap layer overlying the Schottky barrier layer. The cap layer is made of a fifth compound semiconductor having a fifth conduction band edge level lower than the fourth conduction band edge level. The cap layer is doped with an impurity. When a bias is applied between the channel layer and the cap layer, then electrons move between the channel layer and the cap layer via tunnelings across the Schottky barrier layer and across the donor layer.

74 Claims, 3 Drawing Sheets

HIGH ELECTRON MOBILITY TRANSISTOR WITH AN IMPROVED INTERFACE BETWEEN DONOR AND SCHOTTKY LAYERS

BACKGROUND OF THE INVENTION

The present invention relates to a semiconductor device, and more particularly to a high electron, mobility transistor with an improved interface between a donor layer and a Schottky layer for allowing a high speed performance in microwave and milliwave ranges.

Ohmic contact is effective to allow the transistor to show a high speed performance. For this reason, the high electron mobility transistors with, ohmic contacts have now received a great deal of attention due to their high speed and high frequency performances. It has been known in this field that it is effective to improve a cap layer for obtaining an ohmic contact.

One of the high electron mobility transistors with an improved cap layer structure is disclosed in IEEE ELECTRON DEVICE LETTERS, Vol. 11, No. 11, Nov. 1990. The cap layer comprises a double layer structure of n-InGaAs/n-InAlAs. Source/drain contacts comprise non-alloyed AuGe/Ni. The non-alloyed AuGe/Ni contacts are provided on the n-InGaAs/n-InAlAs cap layer. The contact resistance is 0.14 Ωmm.

Another high electron mobility transistor with an improved cap layer structure is disclosed in Japanese Applied Physics, Vol. 27, No. 9, September 1988, pp. 1718–1722. Non-alloyed ohmic contact is provided on an n-InAs layer on an n-In$_x$Ga$_{1-x}$As compositionally graded layer which is further provided on n-GaAs layer.

Still another high electron mobility transistor with an improved cap layer structure is disclosed in IEEE MTT-S Digest, 1994. The cap layer on which source/drain contacts are formed comprises n-In0.53Ga0.47As/n-In0.7Ga0.3As.

The above conventional cap layer structures are designed so as to reduce the contact resistance of the non-alloyed ohmic contact. The cap layers are difficult to form in the above double-layered cap structure and the compositionally graded cap layer structure. In the cap layer, a recess portion has to be formed within which a gate electrode is formed on a Schottky layer underlying the cap layer. The recessed portion is formed by a wet etching. Etching rates are different for different materials and also different for varied compositions. The variation in the etching rate renders it difficult to form the recessed portion with a predetermined shape.

For the above reasons, in order to reduce the series resistance, it is not effective to provide a cap layer compositionally graded or comprising laminations of different semiconductor compound layers. Under the above circumstance, the present invention was conceived by changing the viewpoint for structural and physical improvements

SUMMARY OF THE INVENTION

Accordingly, it is a primary object of the present invention to provide a novel semiconductor multi-layer structure, included in a high electron mobility transistor, which enables the transistor to have an extremely low series contact resistance.

It is a further object of the present invention to provide a novel semiconductor multi-layer structure, included in a high electron mobility transistor, which enables the transistor to show extremely high speed and high frequency performances.

It is still a further object of the present invention to provide a novel semiconductor multi-layer structure, included in a high electron mobility transistor, which enables the transistor to be free from the above problems.

It is yet a further object of the present invention to provide a novel high electron mobility transistor with an extremely low series resistance.

It is a furthermore object of the present invention to provide a novel high electron mobility transistor showing extremely high speed and high frequency performance.

It is a moreover object of the present invention to provide a novel high electron mobility transistor free from the above problems.

The above and other objects, features and advantages of the present invention will be apparent from the following description.

The present invention provides a semiconductor multi-layer structure which has a channel layer made of a first compound semiconductor having a first conduction band edge level. The channel layer has a first thickness sufficient for confining a two-dimensional electron gas. The semiconductor multi-layer structure also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The semiconductor multi-layer structure also has a single quantum well layer overlying the donor layer. The quantum well layer is made of a third compound semiconductor having a third conduction band edge level lower than the second conduction band edge level. The single quantum well layer is sufficiently thin for preventing any formation of a two-dimensional electron gas. The semiconductor multi-layer structure also has a Schottky barrier layer overlying the single quantum well layer. The Schottky barrier layer is made of a fourth compound semiconductor having a fourth conduction band edge level higher than the third conduction band edge level. The Schottky barrier layer is sufficiently thin for allowing electrons to show a tunneling across the Shottky barrier layer. The semiconductor multi-layer structure also has a cap layer overlying the Schottky barrier layer. The cap layer is made of a fifth compound semiconductor having a fifth conduction band edge level lower than the fourth conduction band edge level. The cap layer is doped with an impurity. When a bias is applied between the channel layer and the cap layer, then electrons move between the channel layer and the cap layer via tunnelings across the Schottky barrier layer and across the donor layer.

The present invention also provides another semiconductor multi-layer structure which has a channel layer made of a first compound semiconductor having a first conduction band edge level. The channel layer has a first thickness sufficient for confining a two-dimensional electron gas. The semiconductor multi-layer structure also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The semiconductor multi-layer structure also has a multiple-quantum well layer structure overlying the donor layer. The multiple-quantum well layer structure comprises at least two quantum well layers and at least one potential barrier layer sandwiched between the quantum well layers. The potential barrier layer is made of the second compound semiconductor. The quantum well layers is made of a third compound semiconductor having a third conduction band edge level lower than the second conduction band edge level. Each of the quantum well layers is sufficiently thin for preventing any formation of a two-dimensional electron gas. The potential barrier layer is sufficiently thin for allowing electrons to show a tunneling across the potential barrier layer. The semiconductor multi-layer structure also has a Shottky barrier layer overlying the top one of the quantum well layers. The Schottky barrier layer is made of a fourth compound semiconductor having a fourth conduction band edge level higher than the third conduction band edge level. The Schottky barrier layer is sufficiently thin for allowing electrons to show a tunneling across the Shottky barrier layer. The semiconductor multi-layer structure also has a cap layer overlying the Schottky barrier layer. The cap layer is made of a fifth compound semiconductor having a fifth conduction band edge level lower than the fourth conduction band edge level. When a bias is applied between the channel layer and the cap layer, then electrons move between the channel layer and the cap layer via tunnelings across the Schottky barrier layer, across the donor layer and across the potential barrier layer.

BRIEF DESCRIPTION OF THE DRAWINGS

Preferred embodiments of the present invention will be described in detail with reference to the accompanying drawings.

DISCLOSURE OF THE INVENTION

Figure 1:
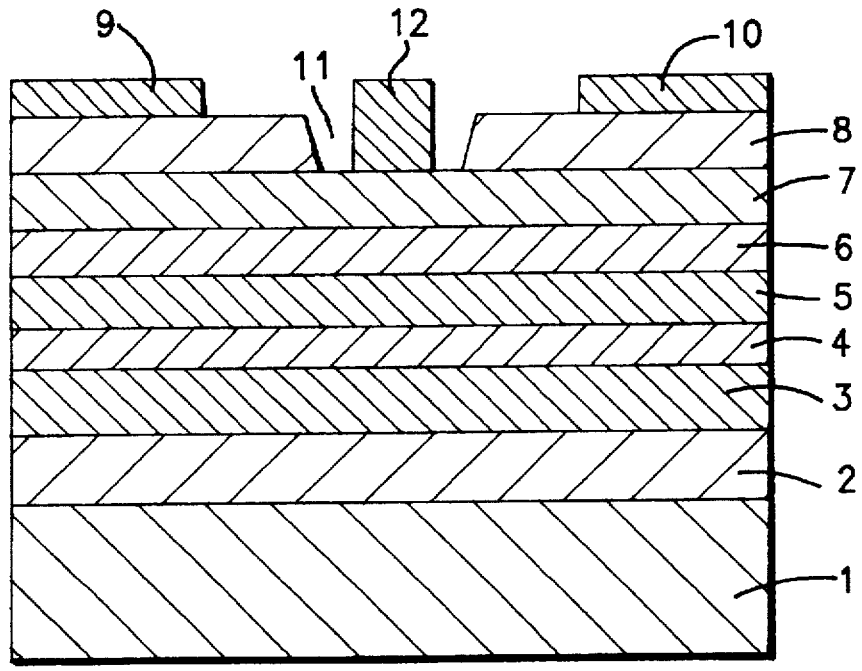
FIG. 1 is a cross sectional elevation view illustrative of a novel high electron mobility transistor in first and second embodiments according to the present invention.

The present invention provides a semiconductor multi-layer structure which has a channel layer made of a first compound semiconductor having a first conduction band edge level. The channel layer has a first thickness sufficient for confining a two-dimensional electron gas. The semiconductor multi-layer structure also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The semiconductor multi-layer structure also has a single quantum well layer overlying the donor layer. The quantum well layer is made of a third compound semiconductor having a third conduction band edge level lower than the second conduction band edge level. The single quantum well layer is sufficiently thin for preventing any formation of a two-dimensional electron gas. The semiconductor multi-layer structure also has a Shottky barrier layer overlying the single quantum well layer. The Schottky barrier layer is made of a fourth compound semiconductor having a fourth conduction band edge level higher than the third conduction band edge level. The Schottky barrier layer is sufficiently thin for allowing electrons to show a tunneling across the Shottky barrier layer. The semiconductor multi-layer structure also has a cap layer overlying the Schottky barrier layer. The cap layer is made of a fifth compound semiconductor having a fifth conduction band edge level lower than the fourth conduction band edge level. The cap layer is doped with an impurity. When a bias is applied between the channel layer and the cap layer, then electrons move between the channel layer and the cap layer via tunnelings across the Schottky barrier layer and across the donor layer.

The donor layer has a thickness not more than 500 angstroms. The Shottky barrier layer has a thickness not more than 500 angstroms. The single quantum well layer has a thickness in the range of 100 angstroms to 150 angstroms. A spacer layer may be sandwiched between the channel layer and the donor layer, provided that the channel layer is undoped with any impurity. In this case, the spacer layer is made of the second compound semiconductor undoped with any impurity. Otherwise, the channel layer is doped with an impurity.

The first compound semiconductor is one selected from the group consisting of InGaAs and GaAs. The second compound semiconductor is one selected from the group consisting of InAlAs and InGaP. Alternatively, the second compound semiconductor is one selected from the group consisting of AlGaAs, InAlAs, InAlSb and InGaSb. The third compound semiconductor is one selected from the group consisting of InGaAs, GaAs, InP, InGaP, InGaSb, InAlSbP. The fourth compound semiconductor is one selected from the group consisting of InAlAS and AlGaAs. The fifth compound semiconductor is one selected from the group consisting of InGaAs, GaAs and InAs.

The present invention also provides another semiconductor multi-layer structure which has a channel layer made of a first compound semiconductor having a first conduction band edge level. The channel layer has a first thickness sufficient for confining a two-dimensional electron gas. The semiconductor multi-layer structure also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The semiconductor multi-layer structure also has a multiple-quantum well layer structure overlying the donor layer. The multiple-quantum well layer structure comprises at least two quantum well layers and at least one potential barrier layer sandwiched between the quantum well layers. The potential barrier layer is made of the second compound semiconductor. The quantum well layers is made of a third compound semiconductor having a third conduction band edge level lower than the second conduction band edge level. Each of the quantum well layers is sufficiently thin for preventing any formation of a two-dimensional electron gas. The potential barrier layer is sufficiently thin for allowing electrons to show a tunneling across the potential barrier layer. The semiconductor multi-layer structure also has a Shottky barrier layer overlying the top one of the quantum well layers. The Schottky barrier layer is made of a fourth compound semiconductor having a fourth conduction band edge level higher than the third conduction band edge level. The Schottky barrier layer is sufficiently thin for allowing electrons to show a tunneling across the Shottky barrier layer. The semiconductor multi-layer structure also has a cap layer overlying the Schottky barrier layer. The cap layer is made of a fifth compound semiconductor having a fifth conduction band edge level lower than the fourth conduction band edge level. When a bias is applied between the channel layer and the cap layer, then electrons move between the channel layer and the cap layer via tunnelings across the Schottky barrier layer, across the donor layer and across the potential barrier layer.

The donor layer has a thickness not more than 500 angstroms. The Shottky barrier layer has a thickness not more than 500 angstroms. The potential barrier layer has a thickness not more than 500 angstroms. Each of the quantum well layers has a thickness in the range of 100 angstroms to 150 angstroms.

A spacer layer may be sandwiched between the channel layer and the donor layer, provided that the channel layer is undoped with any impurity. In this case, the spacer layer is made of the second compound semiconductor undoped with any impurity. Otherwise, the channel layer is doped with an impurity.

The first compound semiconductor is one selected from the group consisting of InGaAs and GaAs. The second compound semiconductor is one selected from the group consisting of InAlAs and InGaP. Alternatively, the second compound semiconductor is one selected from the group consisting of AlGaAs, InAlAs, InAlSb and InGaSb. The third compound semiconductor is one selected from the group consisting of InGaAs, GaAs, InP, InGaP, InGaSb, InAlSbP. The fourth compound semiconductor is one selected from the group consisting of InAlAs and AlGaAs. The fifth compound semiconductor is one selected from the group consisting of InGaAs, GaAs and InAs.

The present invention also provides a high electron mobility field effect transistor which has a channel layer overlying a semiconductor substrate. The channel layer is made of a first compound semiconductor having a first conduction band edge level. The channel layer has a first thickness sufficient for confining a two-dimensional electron gas. The high electron mobility field effect transistor also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The high electron mobility field effect transistor also has a single quantum well layer overlying the donor layer. The quantum well layer is made of a third compound semiconductor having a third conduction band edge level lower than the second conduction band edge level. The single quantum well layer is sufficiently thin for preventing any formation of a two-dimensional electron gas. The high electron mobility field effect transistor also has a Shottky barrier layer overlying the single quantum well layer. The Schottky barrier layer is made of a fourth compound semiconductor having a fourth conduction band edge level higher than the third conduction band edge level. The Schottky barrier layer is sufficiently thin for allowing electrons to show a tunneling across the Shottky barrier layer. The high electron mobility field effect transistor also has a cap layer with a recessed portion overlying the Schottky barrier layer. The cap layer is made of a fifth compound semiconductor having a fifth conduction band edge level lower than the fourth conduction band edge level. The cap layer is doped with an impurity. The high electron mobility field effect transistor also has a Schottky gate electrode provided in the recessed portion of the cap layer so as to be spaced apart from the cap layer. Source/drain electrodes are provided on the cap layer. When a bias is applied between the source/drain electrodes, then electrons move between the channel layer and the cap layer via tunnelings across the Schottky barrier layer and across the donor layer.

The donor layer has a thickness not more than 500 angstroms. The Shottky barrier layer has a thickness not more than 500 angstroms. The single quantum well layer has a thickness in the range of 100 angstroms to 150 angstroms.

A spacer layer may be sandwiched between the channel layer and the donor layer, provided that the channel layer is undoped with any impurity. In this case, the spacer layer is made of the second compound semiconductor undoped with any impurity. Otherwise, the channel layer is doped with an impurity.

The first compound semiconductor is one selected from the group consisting of InGaAs and GaAs. The second compound semiconductor is one selected from the group consisting of InAlAs and InGaP. Alternatively, the second compound semiconductor is one selected from the group consisting of AlGaAs, InAlAs, InAlSb and InGaSb. The third compound semiconductor is one selected from the group consisting of InGaAs, GaAs, Inp, InGaP, InGaSb, InAlSbP. The fourth compound semiconductor is one selected from the group consisting of InAlAs and AGaAs. The fifth compound semiconductor is one selected from the group consisting of InGaAs, GaAs and InAs.

A buffer layer may be provided between the semiconductor substrate and the channel layer. The buffer layer is made of a sixth compound semiconductor having a sixth conduction band edge level higher than the first conduction band edge level. The sixth compound semiconductor is one selected from the group consisting of i-InAlAs and i-InP. An additional donor layer may be provided between the semiconductor substrate and the channel layer. The additional donor layer is made of a seventh compound semiconductor having a seventh conduction band edge level higher than the first conduction band edge level. The additional donor layer is doped with an impurity. An additional spacer layer may be sandwiched between the channel layer and the additional donor layer, provided that the channel layer is undoped with any impurity. In this case, the additional spacer layer is made of the seventh compound semiconductor undoped with any impurity. Otherwise, the channel layer is doped with an impurity. The source/drain electrodes may be made of Ti/Pt/Au. The source/drain electrodes may also be made of WSi. The source/drain electrodes may also be made of Mo.

The present invention provides another high electron mobility field effect transistor which has a channel layer overlying a semiconductor substrate. The channel layer is made of a first compound semiconductor having a first conduction band edge level. The channel layer has a first thickness sufficient for confining a two-dimensional electron gas. The high electron mobility field effect transistor also has a donor layer overlying the channel layer. The donor layer is made of a second compound semiconductor having a second conduction band edge level higher than the first conduction band edge level. The donor layer is doped with an impurity. The donor layer is sufficiently thin for allowing electrons to show a tunneling across the donor layer. The high electron mobility field effect transistor also has a multiple-quantum well layer structure overlying the donor layer. The multiple-quantum well layer structure comprises at least two quantum well layers and at least one potential barrier layer sandwiched between the quantum well layers. The potential barrier layer is made of the second compound semiconductor. The quantum well layers are made of a third compound semiconductor having a third conduction band edge level lower than the second conduction band edge level. Each of the quantum well layers is sufficiently thin for preventing any formation of a two-dimensional electron gas. The potential barrier layer is sufficiently thin for allowing electrons to show a tunneling across the potential barrier layer. The high electron mobility field effect transistor also has a Shottky barrier layer overlying the top one of the quantum well layers. The Schottky barrier layer is made of a fourth compound semiconductor having a fourth conduction band edge level higher than the third conduction band edge level. The Shottky barrier layer is sufficiently thin for allowing electrons to show a tunneling across the Shottky barrier layer. The high electron mobility field effect transistor also has a cap layer overlying the Schottky barrier layer. The cap layer is made of a fifth compound semiconductor having a fifth conduction band edge level lower than the fourth conduction band edge level. The high electron mobility field effect transistor also has a Schottky gate electrode provided in the recessed portion of the cap layer so as to be spaced apart from the cap layer. Source/drain electrodes are provided on the cap layer. When a bias is applied between the channel layer and the cap layer, then electrons move between the channel layer and the cap layer via tunnelings across the Schottky barrier layer, across the donor layer and across the potential barrier layer.

The donor layer has a thickness not more than 500 angstroms. The Shottky barrier layer has a thickness not more than 500 angstroms. The potential barrier layer has a thickness not more than 500 angstroms. Each of the quantum well layers has a thickness in the range of 100 angstroms to 150 angstroms.

A spacer layer may be sandwiched between the channel layer and the donor layer, provided that the channel layer is undoped with any impurity. In this case, the spacer layer is made of the second compound semiconductor undoped with any impurity. Otherwise, the channel layer is doped with an impurity.

The first compound semiconductor is one selected from the group consisting of InGaAs and GaAs. Alteratively, the second compound semiconductor is one selected from the group consisting of InAlAs and InGaP. The second compound semiconductor is one selected from the group consisting of AlGaAs, InAlAs, InAlSb and InGaSb. The third compound semiconductor is one selected from the group consisting of InGaAs, GaAs, InP, InGaP, InGaSb, InAlSbP. The fourth compound semiconductor is one selected from the group consisting of InALAs and AlGaAs. The fifth compound semiconductor is one selected from the group consisting of InGaAs, GaAs and InAs.

A buffer layer may be provided between the semiconductor substrate and the channel layer. The buffer layer is made of a sixth compound semiconductor having a sixth conduction band edge level higher than the first conduction band edge level. The sixth compound semiconductor is one selected from the group consisting of i-InAlAs and i-InP.

An additional donor layer may be provide between the semiconductor substrate and the channel layer. The additional donor layer is made of a seventh compound semiconductor having a seventh conduction band edge level higher than the first conduction band edge level. The additional donor layer is doped with an impurity.

An additional spacer layer may be sandwiched between the channel layer and the additional donor layer, provided that the channel layer is undoped with any impurity. The additional spacer layer is made of the seventh compound semiconductor undoped with any impurity. Otherwise, the channel layer 3 is doped with an impurity.

The source/drain electrodes may be made of Ti/Pt/Au. The source/drain electrodes may also be made of WSi. The source/drain electrodes may also be made of Mo.

EMBODIMENTS

A first embodiment according to the present invention will be described with reference to FIGS. 1, 2A and 2B, which provides a novel high electron mobility transistor with an improved interface between a donor layer and a Schottky layer. The novel high electron mobility transistor is formed on a semi-insulating InP substrate 1. A buffer layer 2 is formed on the semi-insulating InP substrate 1. The buffer layer 2 is made of undoped $In_{0.52}Al_{0.48}As$. A channel layer 3 is formed on the buffer layer 2. The channel layer 3 is made of undoped $In_{0.53}Ga_{0.47}As$. A spacer layer 4 is formed on the channel layer 3. The spacer layer 4 is made of undoped $In_{0.52}Al_{0.48}As$. A donor layer 5 is formed on the spacer layer 4. The donor layer 5 is made of $In_{0.52}Al_{0.48}As$ doped with an impurity such as Si. A single quantum well layer 6 is formed on the donor layer 5. The single quantum well layer 6 is made of undoped $In_xGa_{1-x}A$. A Schottky layer 7 is formed on the single quantum well layer 6. The Schottky layer 7 is made of undoped $In_{0.52}Al_{0.48}As$. A cap layer 8 with a recessed portion is formed on the Schottky layer 7. The cap layer 8 is made of $In_{0.53}Ga_{0.47}$ As doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

Figure 2A:
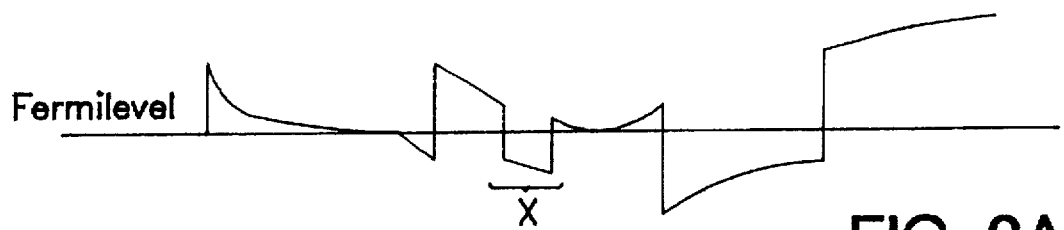
FIG. 2A is a diagram illustrative of a conduction band edge profile across source/drain electrodes to a buffer layer in a novel high electron mobility transistor in first, second, third, fourth, seventh and eighth embodiments according to the present invention.

FIG. 2A is illustrative of a conduction band edge profile across source/drain electrodes to a buffer layer of the above novel high electron mobility transistor. FIG. 2B is illustrative of a conduction band edge profile across a gate electrode to a buffer layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The donor and spacer layers 5 and 4 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the spacer layer 4. The weight center of the two-dimensional electron gas is somewhat closed to the spacer layer 4. The bottom of the narrow quantum well of the quantum well layer 6 is varied by varying the ratio of composition of In, or the index "X". If the compositional ratio of In is increased, then the conduction band edge is dropped. This means that the bottom of the narrow quantum well is lowered.

The cap layer 8 has a thickness of 50 nanometers. The Schottky layer 7 has a thickness of 5 nanometers. The donor layer S has a thickness of 20 nanometers. The impurity concentration of the donor layer 5 is $2.5 \times 10^{18}$ cm$^{-3}$. The single quantum well layer 6 has a thickness of 5 nanometers. The index "x" is 0.53. If the width of the potential barrier of each of the Schottky layer 7 and the donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The donor layer 5 is doped with the impurity such as Si so that the conduction band edge is curved to drop the center the intermediate point to the Fermi level. This curved profile of the conduction band edge of the donor layer 5 facilitates the electron tunneling across the potential barrier constituted by the donor layer 5. The width of the potential barrier of the donor layer 5 is set at 20 nanometers and the width of the spacer layer 5 is set close to the thickness of the single quantum well layer 6. The measured contact resistance under the source/drain electrodes is 0.5 Ωmm. When the compositional ratio of In is increased to "x"=0.8, the measured contact resistance under the source/drain electrodes is 0.1 Ωmm. In this case, the channel layer 3 is the strained layer.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the spacer layer 4. This Schottky barrier prevents electron tunnelings to the channel layer 3

Figure 2B:
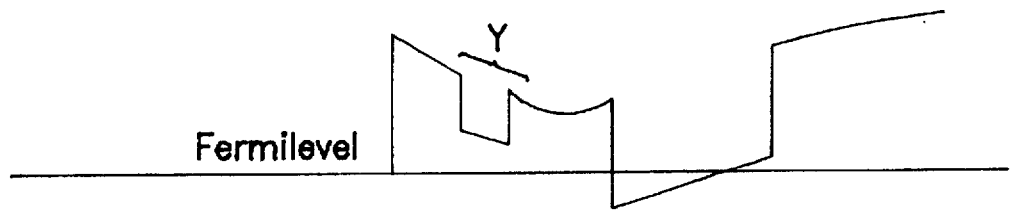
FIG. 2B is a diagram illustrative of a conduction band edge profile across a gate electrode to a buffer layer in a novel high electron mobility transistor in first and second embodiments according to the present invention.

Variations in the materials and in the thickness of the individual layers are available provided that the conduction band edge profile is kept as illustrated in FIGS. 2A and 2B. For example, undoped InP is available for the buffer layer 2. Undoped InGaP is also available for the spacer layer 4. An impurity doped InGaP is also available for the donor layer 5. Undoped GaAs, undoped InP, undoped InGaP, undoped InGaSb and undoped InAlSbP are also available for the single quantum well layer 6. Undoped AlGaAs is also available for the Schottky layer. The source/drain electrodes may be made of WSi or Mo. The compositional ratio or the index "x" of In in the single quantum well layer 6 is variable to match various conditions and design requirements.

A second embodiment according to the present invention will be described with reference again to FIGS. 1, 2A and 2B, which provides a novel high electron mobility transistor with an improved interface between a donor layer and a Schottky layer. A physical and structural difference of the transistor between the first and second embodiment is only in the material system. Whereas in the first embodiment the transistor is formed on the InP substrate, in the second embodiment GaAs substrate is used.

The novel high electron mobility transistor is formed on a semi-insulating GaAs substrate 1. A buffer layer 2 is formed on the semi-insulating GaAs substrate 1. The buffer layer 2 is made of undoped AlGaAs. A channel layer 3 is formed on the buffer layer 2. The channel layer 3 is made of undoped $In_{0.53}Ga_{0.47}As$. A spacer layer 4 is formed on the channel layer 3. The spacer layer 4 is made of undoped AlGaAs. A donor layer 5 is formed on the spacer layer 4. The donor layer 5 is made of AlGaAs doped with an impurity such as Si. A single quantum well layer 6 is formed on the donor layer 5. The single quantum well layer 6 is made of undoped $In_xGa_{1-x}As$. A Schottky layer 7 is formed on the single quantum well layer 6. The Schottky layer 7 is made of undoped AlGaAs. A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

FIG. 2A is illustrative of a conduction band edge profile across source/drain electrodes to a buffer layer of the above novel high electron mobility transistor. FIG. 2B is illustrative of a conduction band edge profile across a gate electrode to a buffer layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The donor and spacer layers 5 and 4 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the spacer layer 4. The weight center of the two-dimensional electron gas is somewhat closed to the spacer layer 4. The bottom of the narrow quantum well of the quantum well layer 6 is varied by varying the ratio of composition of In, or the index "X". If the compositional ratio of In is increased, then the conduction band edge is dropped. This means that the bottom of the narrow quantum well is lowered.

The cap layer 8 has a thickness of 50 nanometers. The Schottky layer 7 has a thickness of 5 nanometers. The donor layer 5 has a thickness of 20 nanometers. The impurity concentration of the donor layer 5 is $2.5\times10^{18}$ cm$^{-3}$. The single quantum well layer 6 has a thickness of 5 nanometers. The index "x" is 0.53. If the width of the potential barrier of each of the Schottky layer 7 and, the donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The donor layer 5 is doped with the impurity such as Si so that the conduction band edge is curved to drop the center the intermediate point to the Fermi level. This curved profile of the conduction band edge of the donor layer 5 facilitates the electron tunneling across the potential barrier constituted by the donor layer 5. The width of the potential barrier of the donor layer 5 is set at 20 nanometers and the width of the spacer layer 5 is set close to the thickness of the single quantum well layer 6.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the spacer layer 4. This Schottky barrier prevents electron tunnelings to the channel layer 3.

Variations in the materials and in the thickness of the individual layers are available provided that the conduction band edge profile is kept as illustrated in FIGS. 2A and 2B. For example, undoped GaAs is available for the channel layer 3. Undoped InAlAs, undoped InAlSb and undoped InGaSb are also available for the spacer layer 4. An impurity doped InAlAS, an impurity doped InAlSb, and an impurity doped InGaSb are also available for the donor layer 5. Undoped GaAs, and undoped InGaP are also available for the single quantum well layer 6. Undoped InAlAs, undoped InAlSb and undoped InGaSb are also available for the Schottky layer. The source/drain electrodes may be made of WSi or Mo. The compositional ratio or the index "x" of In in the single quantum well layer 6 is variable to match various conditions and design requirements.

Figure 3:
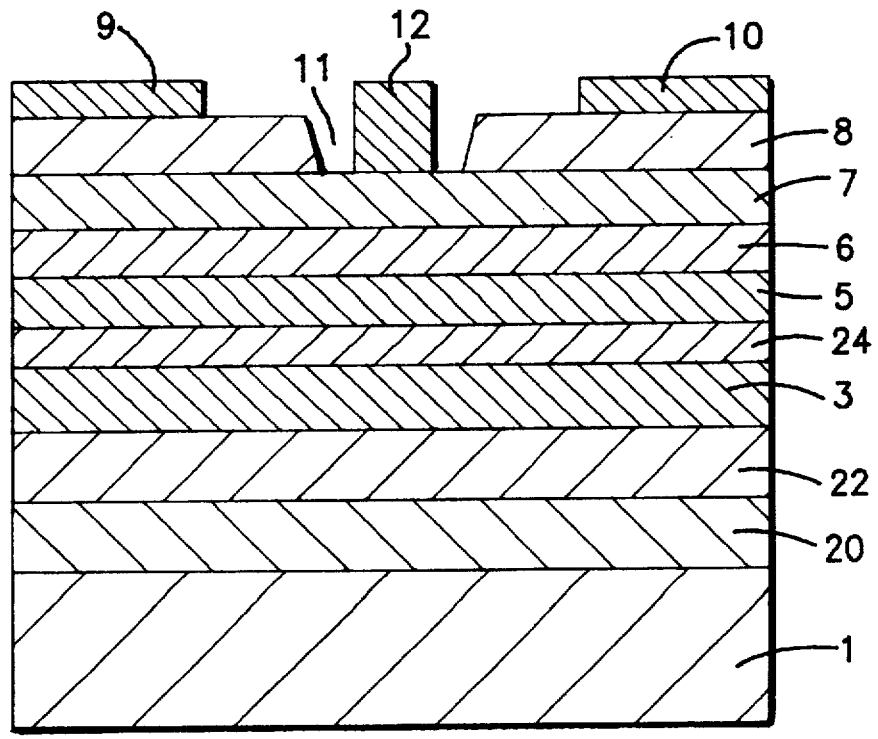
FIG. 3 is a cross sectional elevation view illustrative of a novel high electron mobility transistor in third and fourth embodiments according to the present invention.

A third embodiment according to the present invention will be described with reference to FIGS. 3, 2A and 2B, which provides a novel high electron mobility transistor with an improved interface between a donor layer and a Schottky layer. The novel high electron mobility transistor is formed on a semi-insulating InP substrate 1. A first donor layer 20 is formed on the semi-insulating InP substrate 1. The first donor layer 20 is made of In$_{0.52}$Al$_{0.48}$As doped with an impurity such as Si. A first spacer layer 22 is formed on the first donor layer 20. The first spacer layer 22 is made of undoped In$_{0.52}$Al$_{0.48}$As. A channel layer 3 is formed on the first spacer layer 22. The channel layer 3 is made of undoped In$_{0.53}$Ga$_{0.47}$As. A second spacer layer 24 is formed on the channel layer 3. The second spacer layer 24 is made of undoped In$_{0.52}$Al$_{0.48}$As. A second donor layer 5 is formed on the second spacer layer 4. The second donor layer 5 is made of In$_{0.52}$Al$_{0.48}$As doped with an impurity such as Si. A single quantum well layer 6 is formed on the donor layer 5. The single quantum well layer 6 is made of undoped In$_x$Ga$_{1-x}$As. A Schottky layer 7 is formed on the single quantum well layer 6. The Schottky layer 7 is made of undoped In$_{0.52}$Al$_{0.48}$As. A cap layer 8 with a recessed portion is formed on the Schottky layer 7. The cap layer 8 is made of In$_{0.53}$Ga$_{0.47}$As doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

FIG. 2A is illustrative of a conduction band edge profile across source/drain electrodes to a first donor layer of the above novel high electron mobility transistor. FIG. 2B is illustrative of a conduction band edge profile across a gate electrode to the first donor layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The second donor and second spacer layers 5 and 24 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the second spacer layer 24. The weight center of the two-dimensional electron gas is somewhat closed to the spacer layer 4. The bottom of the narrow quantum well of the quantum well layer 6 is varied by varying the ratio of composition of In, or the index "X". If the compositional ratio of In is increased, then the conduction band edge is dropped. This means that the bottom of the narrow quantum well is lowered.

The cap layer 8 has a thickness of 50 nanometers. The Schottky layer 7 has a thickness of 5 nanometers. The second donor layer 5 has a thickness of 20 nanometers. The impurity concentration of the second donor layer 5 is $2.5\times10^{18}$ cm$^{-3}$. The single quantum well layer 6 has a thickness of 5 nanometers. The index "x" is 0.53. If the width of the potential barrier of each of the Schottky layer 7 and the second donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The second donor layer 5 is doped with the impurity such as Si so that the conduction band edge is curved to drop the center the intermediate point to the Fermi level. This curved profile of the conduction band edge of the second donor layer 5 facilitates the electron tunneling across the potential barrier constituted by the second donor layer 5. The width of the potential barrier of the second donor layer 5 is set at 20 nanometers and the width of the second spacer layer 24 is set close to the thickness of the single quantum well layer 6. The measured contact resistance under the source/drain electrodes is 0.5 Ωmm. When the compositional ratio of In is increased to "x"=0.8, the measured contact resistance under the source/drain electrodes is 0.1 Ωmm. In this case, the channel layer 3 is the strained layer.

On the other hand, under the gate electrode 12, the Schottky barrier with sufficient height and thickness to prevent electron tunneling is formed. The narrow quantum well of the single quantum well layer 6 is positioned above the Fermi level Thus, the narrow quantum well has no energy level at which electrons are allowed to exist. For this reason, under the gate electrode, the Schottky barrier extends from the Schottky layer 7 to the second spacer layer 24. This Schottky barrier prevents electron tunnelings to the channel layer 3.

Variations in the materials and in the thickness of the individual layers are available provided that the conduction band edge profile is kept as illustrated in FIGS. 2A and 2B. For example, undoped InP is available for the first donor layer 20. Undoped InP is also available for the first spacer layer 22. Undoped InGaP is also available for the second spacer layer 24. An impurity doped InGaP is also available for the donor layer 5. Undoped GaAs, undoped InP, undoped InGaP, undoped InGaSb and undoped InAlSbP are also available for the single quantum well layer 6. Undoped AlGaAs is also available for the Schottky layer. The source/ drain electrodes may be made of WSi or Mo. The compositional ratio or the index "x" of In in the single quantum well layer 6 is variable to match various conditions and design requirements.

A fourth embodiment according to the present invention will be described with reference again to FIGS. 3, 2A and 2B, which provides a novel high electron mobility transistor with an improved interface between a donor layer and a Schottky layer. A physical and structural difference of the transistor between the third and fourth embodiment is only in the material system. Whereas in the third embodiment the transistor is formed on the InP substrate, in the fourth embodiment GaAs substrate is used.

The novel high electron mobility transistor is formed on a semi-insulating GaAs substrate 1. A first donor layer 20 is formed on the semi-insulating GaAs substrate 1. The first donor layer 20 is made of AlGaAs doped with an impurity such as Si. A first spacer layer 22 is formed on the first donor layer 20. The first spacer layer 22 is made of undoped AlGaAs. A channel layer 3 is formed on the first spacer layer 22. The channel layer 3 is made of undoped $In_{0.53}Ga_{0.47}As$. A second spacer layer 24 is formed on the channel layer 3. The second spacer layer 24 is made of undoped AlGaAs. A second donor layer 5 is formed on the second spacer layer 4. The second donor layer 5 is made of AlGaAs doped with an impurity such as Si. A single quantum well layer 6 is formed on the donor layer 5. The single quantum well layer 6 is made of undoped $In_xGa_{1-x}As$. A Schottky layer 7 is formed on the single quantum well layer 6. The Schottky layer 7 is made of undoped AlGaAs. A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 77 wherein the gate electrode 12 is spaced apart from the cap layer 8.

FIG. 2A is illustrative of a conduction band edge profile across source/drain electrodes to a first donor layer of the above novel high electron mobility transistor. FIG. 2B is illustrative of a conduction band edge profile across a gate electrode to the first donor layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The second donor and second spacer layers 5 and 24 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the second spacer layer 24. The weight center of the two-dimensional electron gas is somewhat closed to the spacer layer 4. The bottom of the narrow quantum well of the quantum well layer 6 is varied by varying the ratio of composition of In, or the index "X". If the compositional ratio of In is increased, then the conduction band edge is dropped. This means, that the bottom of the narrow quantum well is lowered.

The cap layer 8 has a thickness of 50 nanometers. The Schottky layer 7 has a thickness of 5 nanometers. The second donor layer 5 has a thickness of 20 nanometers. The impurity concentration of the second donor layer 5 is $2.5 \times 10^{18}$ cm$^{-3}$. The single quantum well layer 6 has a thickness of 5 nanometers. The index "x" is 0.53. If the width of the potential barrier of each of the Schottky layer 7 and the second donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The second donor layer 5 is doped with the impurity such as Si so that the conduction band edge is curved to drop the center the intermediate point to the Fermi level. This curved profile of the conduction band edge of the second donor layer 5 facilitates the electron tunneling across the potential barrier constituted by the second donor layer 5. The width of the potential barrier of the second donor layer 5 is set at 20 nanometers and the width of the second spacer layer 24 is set close to the thickness of the single quantum well layer 6. The measured contact resistance under the source/drain electrodes is 0.5 Ωmm. When the compositional ratio of In is increased to "x"=0.8, the measured contact resistance under the source/drain electrodes is 0.1 Ωmm. In this case, the channel layer 3 is the strained layer.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the second spacer layer 24. This Schottky barrier prevents electron tunnelings to the channel layer 3.

Variations in the materials and in the thickness of the individual layers are available provided that the conduction band edge profile is kept as illustrated in FIGS. 2A and 2B. For example, undoped InAlAs, undoped InAlSb, and undoped InGaSb are available for the first donor layer 20. Undoped InAlAs, undoped InAlSb and undoped InGaSb are also available for the first spacer layer 22. Undoped GaAs is also available for the channel layer 3. Undoped InAlAs, undoped InAlSb, and undoped InGaSb are also available for the second spacer layer 24. An impurity doped InAlAs, an impurity doped InAlSb, an impurity doped InGaSb are also available for the second donor layer 5. Undoped GaAs and undoped InGaP are also available for the single quantum well layer 6. Undoped InAlAs, undoped InAlSb, undoped InGaSb are also available for the Schottky layer. The source/drain electrodes may be made of WSi or Mo. The compositional ratio or the index "x" of In in the single quantum well layer 6 is variable to match various conditions and design requirements.

Figure 4:
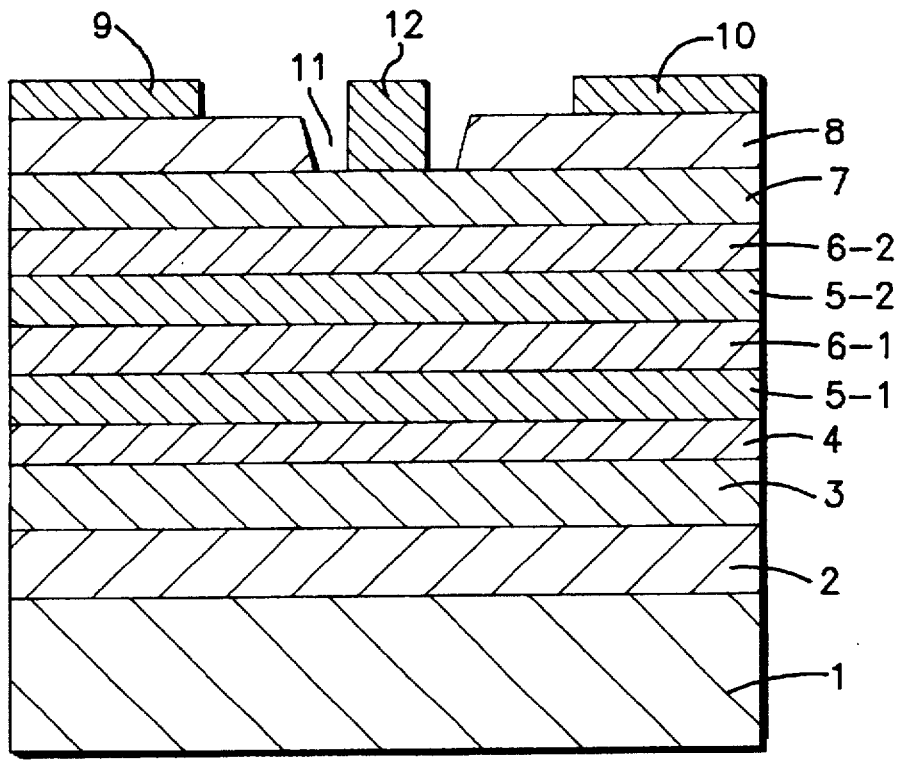
FIG. 4 is a cross sectional elevation view illustrative of a novel high electron mobility transistor in fifth and sixth embodiments according to the present invention.

A fifth embodiment according to the present invention will be described with reference to FIGS. 4, 6A and 6B, which provides a novel high electron mobility transistor with an improved interface between a donor layer and a Schottky layer. The novel high electron mobility transistor is formed on a semi-insulating InP substrate 1. A buffer layer 2 is formed on the semi-insulating InP substrate 1. The buffer layer 2 is made of undoped $In_{0.52}Al_{0.48}As$. A channel layer 3 is formed on the buffer layer 2. The channel layer 3 is made of undoped $In_{0.53}Ga_{0.47}As$. A spacer layer 4 is formed on the channel layer 3. The spacer layer 4 is made of undoped $In_{0.52}Al_{0.48}As$. A first donor layer 5-1 is formed on the spacer layer 4. The first donor layer 5-1 is made of $In_{0.52}Al_{0.48}As$ doped with an impurity such as Si. A first quantum well layer 6-1 is formed on the first donor layer 5-1. The first quantum well layer 6-1 is made of undoped $In_xGa_{1-x}As$. A second donor layer 5-2 is formed on the first quantum well layer 6-1. The second donor layer 5-2 is made of $In_{0.52}Al_{0.48}As$ doped with an impurity such as Si. A second quantum well layer 6-2 is formed on the second donor layer 5-2. The second quantum well layer 6-2 is made of undoped $In_xGa_{1-x}As$. The double quantum well layers 6-1 and 6-2 are provided. A Schottky layer 7 is formed on the second quantum well layer 6-2. The Schottky layer 7 is made of undoped $In_{0.52}Al_{0.48}As$. A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

Figure 5A:
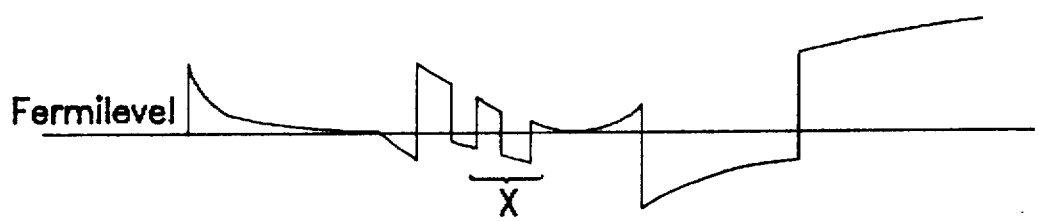
FIG. 5A is a diagram illustrative of a conduction band edge profile across source/drain electrodes to a buffer layer in a novel high electron mobility transistor in fifth and sixth embodiments according to the present invention.
Figure 5B:
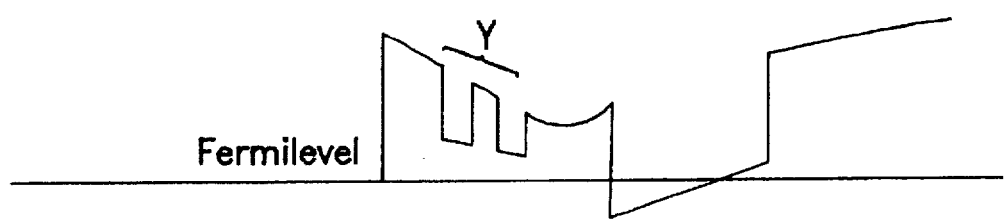
FIG. 5B is a diagram illustrative of a conduction band edge profile across a gate electrode to a buffer layer in a novel high electron mobility transistor in fifth and sixth embodiments according to the present invention.

FIG. 5A is illustrative of a conduction band edge profile across source/drain electrodes to a buffer layer of the above novel high electron mobility transistor with the double quantum wells. FIG. 5B is illustrative of a conduction band edge profile across a gate electrode to a buffer layer of the above novel high electron mobility transistor with the double quantum wells. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 5B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The second donor and spacer layers 5-1 and 4 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the spacer layer 4. The weight center of the two-dimensional electron gas is somewhat closed to the spacer layer 4. In this embodiment, the double quantum wells are formed. The bottom of the narrow quantum well of the quantum well layers 6-1 and 6-2 are varied by varying the ratio of composition of In, or the index "X". If the compositional ratio of In is increased, then the conduction band edge is dropped. This means that the bottom of the narrow quantum well is lowered. The double quantum well structure further facilitates electron tunnelings.

The cap layer 8 has a thickness of 50 nanometers. The Schottky layer 7 has a thickness of 5 nanometers. The first and second donor layers 5-1 and 5-2 have a thickness of 20 nanometers. The impurity concentration of the first and second donor layers 5-1, and 5-2 are $2.5 \times 10^{18}$ $cm^{-3}$. The double quantum well layers 6-1 and 6-2 have a thickness of 5 nanometers. The index "x" is 0.53. If the width of the potential barrier of each of the Schottky layer 7 and the first and second donor layers 5-1 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The first and second donor layers 5-1 and 5-2 are doped with the impurity such as Si so that the conduction band edges are curved to drop the center the intermediate point to the Fermi level. This curved profile of the conduction band edge of the first donor layer 5-1 facilitates the electron tunneling across the potential barrier constituted by the first donor layer 5-1. The width of the potential barrier of the first donor layer 5-1 is set at 20 nanometers and the width of the spacer layer 5 is set close to the thickness of the single quantum well layer 6.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the spacer layer 4. This Schottky barrier prevents electron tunnelings to the channel layer 3.

Variations in the materials and in the thickness of the individual layers are available provided that the conduction band edge profile is kept as illustrated in FIGS. 5A and 5B. For example, undoped InP is available for the buffer layer 2. Undoped InGaP is also available for the spacer layer 4. An impurity doped InGaP is also available for the first donor layer 5-1. Undoped GaAs, undoped InP, undoped InGaP, undoped InGaSb and undoped InAlSbP are also available for the single quantum well layer 6. Undoped AlGaAs is also available for the Schottky layer. The source/drain electrodes may be made of WSi or Mo. The compositional ratio or the index "x" of In in the single quantum well layer 6 is variable to match various conditions and design requirements.

A sixth embodiment according to the present invention will be described with reference again to FIGS. 4, 5A and 5B, which provides a novel high electron mobility transistor with an improved interface between a donor layer and a Schottky layer. A physical and structural difference of the transistor between the fifth and sixth embodiment is only in the material system. Whereas in the fifth embodiment the transistor is formed on the InP substrate, in the sixth embodiment GaAs substrate is used.

The novel high electron mobility transistor is formed on a semi-insulating GaAs substrate 1. A buffer layer 2 is formed on the semi-insulating GaAs substrate 1. The buffer layer 2 is made of undoped AlGaAs. A channel layer 3 is formed on the buffer layer 2. The channel layer 3 is made of undoped $In_{0.53}Ga_{0.47}As$. A spacer layer 4 is formed on the channel layer 3. The spacer layer 4 is made of undoped AlGaAs. A first donor layer 5-1 is formed on the spacer layer 4. The first donor layer 5-1 is made of AlGaAs doped with an impurity such as Si. A first quantum well layer 6-1 is formed on the first donor layer 5-1. The first quantum well layer 6-1 is made of undoped $In_xGa_{1-x}As$. A second donor layer 5-2 is formed on the first quantum well layer 6-1. The second donor layer 5-2 is made of AlGaAs doped with an impurity such as Si. A second quantum well layer 6-2 is formed on the second donor layer 5-2. The second quantum well layer 6-2 is made of undoped $In_xGa_{1-x}As$. The double quantum well layers 6-1 and 6-2 are provided. A Schottky layer 7 is formed on the second quantum well layer 6-2. The Schottky layer 7 is made of undoped AlGaAs. A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

FIG. 5A is illustrative of a conduction band edge profile across source/drain electrodes to a buffer layer of the above novel high electron mobility transistor with the double quantum wells. FIG. 5B is illustrative of a conduction band edge profile across a gate electrode to a buffer layer of the above novel high electron mobility transistor with the double quantum wells. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 5B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The second donor and spacer layers 5-1 and 4 provide a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the spacer layer 4. The weight center of the two-dimensional electron gas is somewhat closed to the spacer layer 4. In this embodiment, the double quantum wells are formed. The bottom of the narrow quantum well of the quantum well layers 6-1 and 6-2 are varied by varying the ratio of composition of In, or the index "X". If the compositional ratio of In is increased, then the conduction band edge is dropped. This means that the bottom of the narrow quantum well is lowered. The double quantum well structure further facilitates electron tunnelings.

The cap layer 8 has a thickness of 50 nanometers. The Schottky layer 7 has a thickness of 5 nanometers. The first and second donor layers 5-1 and 5-2 have a thickness of 20 nanometers. The impurity concentration of the first and second donor layers 5-1, and 5-2 are $2.5 \times 10^{18}$ cm$^{-3}$. The double quantum well layers 6-1 and 6-2 have a thickness of 5 nanometers. The index "x" is 0.53. If the width of the potential barrier of each of the Schottky layer 7 and the first and second donor layers 5-1 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The first and second donor layers 5-1 and 5-2 are doped with the impurity such as Si so that the conduction band edges are curved to drop the center the intermediate point to the Fermi level. This curved profile of the conduction band edge of the first donor layer 5-1 facilitates the electron tunneling across the potential barrier constituted by the first donor layer 5-1. The width of the potential barrier of the first donor layer 5-1 is set at 20 nanometers and the width of the spacer layer 5 is set close to the thickness of the single quantum well layer 6.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the spacer layer 4. This Schottky barrier prevents electron tunnelings to the channel layer 3.

Variations in the materials and in the thickness of the individual layers are available provided that the conduction band edge profile is kept as illustrated in FIGS. 5A and 5B. For example, undoped GaAs is available for the channel layer 3. Undoped InGaP, undoped InAlAs, undoped InAlSb, undoped InGaSb are also available for the spacer layer 4. An impurity doped InGaP, an impurity doped InAlAs, an impurity doped InAlSb, an impurity InGaSb are also available for the first and second donor layers 5-1 and 5-2. Undoped GaAs and undoped InGaP are also available for the first and second quantum well layers 6-1 and 6-2. Undoped Ins, undoped InAlSb, and InGaSb are also available for the Schottky layer. The source/drain electrodes may be made of WSi or Mo. The compositional ratio or the index "x" of In in the single quantum well layer 6 is variable to match various conditions and design requirements.

Figure 6:
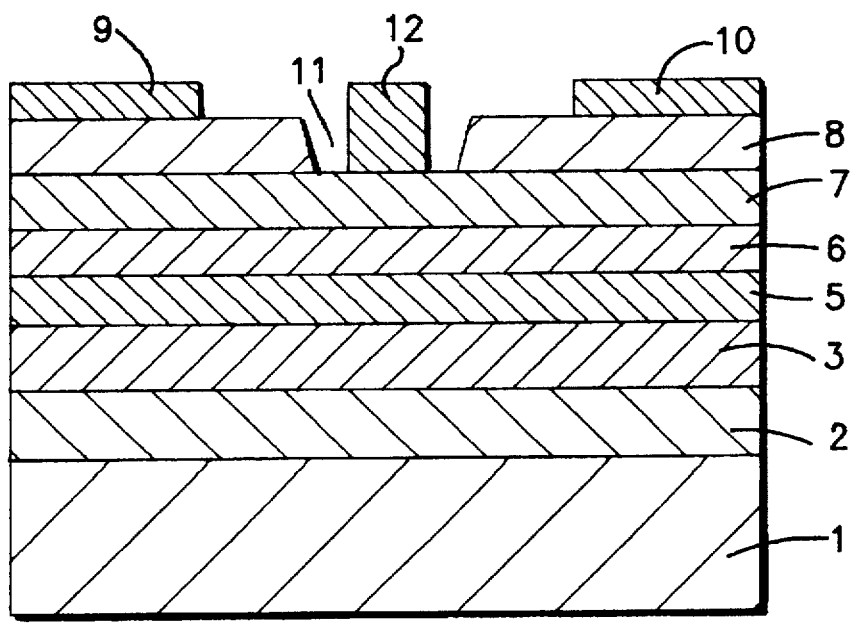
FIG. 6 is a cross sectional elevation view illustrative of a novel high electron mobility transistor in seventh and eighth embodiments according to the present invention.

A seventh embodiment according to the present invention will be described with reference to FIGS. 6, 5A and 5B, which provides a novel high electron mobility transistor with an improved interface between a donor layer and a Schottky layer. The novel high electron mobility transistor is formed on a semi-insulating InP substrate 1. A buffer layer 2 is formed on the semi-insulating InP substrate 1. The buffer layer 2 is made of undoped $In_{0.52}Al_{0.48}As$. A channel layer 3 is formed on the buffer layer 2. The channel layer 3 is made of impurity-doped $In_{0.53}Ga_{0.47}As$. A donor layer 5 is formed on the channel layer 3. The donor layer 5 is made of $In_{0.52}A_{0.48}As$ doped with an impurity such as Si. A single quantum well layer 6 is formed on the donor layer 5. The single quantum well layer 6 is made of undoped $In_xGa_{1-x}As$. A Schottky layer 7 is formed on the single quantum well layer 6. The Schottky layer 7, is made of undoped $In_{0.52}Al_{0.48}As$ A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

FIG. 2A is illustrative of a conduction band edge profile across source/drain electrodes to a buffer layer of the above novel high electron mobility transistor. FIG. 2B is illustrative of a conduction band edge profile across a gate electrode to a buffer layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10, the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The donor layer 5 provides a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the donor layer 5. The weight center of the two-dimensional electron gas is somewhat closed to the donor layer 5. The bottom of the narrow quantum well of the quantum well layer 6 is varied by varying the ratio of composition of In, or the index "X". If the compositional ratio of In is increased, then the conduction band edge is dropped. This means that the bottom of the narrow quantum well is lowered.

The cap layer 8 has a thickness of 50 nanometers. The Schottky layer 7 has a thickness of 5 nanometers. The donor layer 5 has a thickness of 20 nanometers. The impurity concentration of the donor layer 5 is $2.5\times10^{18}$ cm$^{-3}$. The single quantum well layer 6 has a thickness of 5 nanometers. The index "x" is 0.53. If the width of the potential barrier of each of the Schottky layer 7 and the donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The donor layer 5 is floped with the impurity such as Si so that the conduction band edge is curved to drop the center the intermediate point to the Fermi level. This curved profile of the conduction band edge of the donor layer 5 facilitates the electron tunneling across the potential barrier constituted by the donor layer 5. The width of the potential barrier of the donor layer 5 is set at 20 nanometers and the width of the spacer layer 5 is set close to the thickness of the single quantum well layer 6. The measured contact resistance under the source/drain electrodes is 0.5 Ωmm. When the compositional ratio of In is increased to "x"=0.8, the measured contact resistance under the source/drain electrodes is 0.1 Ωmm. In this case, the channel layer 3 is the strained layer.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the donor layer 5. This Schottky barrier prevents electron tunnelings to the channel layer 3.

Variations in the materials and in the thickness of the individual layers are available provided that the conduction band edge profile is kept as illustrated in FIGS. 2A and 2B. For example, undoped InP is available for the buffer layer 2. Undoped InGaP is also available for the spacer layer 4. An impurity doped InGaP is also available for the donor layer 5. Undoped GaAs, undoped InP, undoped InGaP, undoped InGaSb and undoped InAlSbP are also available for the single quantum well layer 6. Undoped AlGaAs is also available for the Schottky layer. The source/drain electrodes may be made of WSi or Mo. The compositional ratio or the index "x" of In in the single quantum well layer 6 is variable to match various conditions and design requirements.

A eighth embodiment according to the present invention will be described with reference again to FIGS. 6, 2A and 2B, which provides a novel high electron mobility transistor with an improved interface between a donor layer and a Schottky layer. A physical and structural difference of the transistor between the seventh and eighth embodiment is only in the material system. Whereas in the seventh embodiment the transistor is formed on the InP substrate, in the eighth embodiment GaAs substrate is used.

The novel high electron mobility transistor is formed on a semi-insulating GaAs substrate 1. A buffer latter 2 is formed on the semi-insulating GaAs substrate 1. The buffer layer 2 is made of undoped AlGaAs. A channel layer 3 is formed on the buffer layer 2. The channel layer 3 is made of undoped $In_{0.53}Ga_{0.47}As$. A donor layer 5 is formed on the channel layer 3. The donor layer 5 is made of AlGaAs doped with an impurity such as Si. A single quantum well layer 6 is formed on the donor layer 5. The single quantum well layer 6 is made of undoped $In_xGa_{1-x}As$. A Schottky layer 7 is formed on the single quantum well layer 6. The Schottky layer 7 is made of undoped AlGAs. A cap layer 8 with a recessed portion is formed on the Schottky layer 7. The cap layer 8 is made of $In_{0.53}Ga_{0.47}As$ doped with an impurity. Source/drain electrodes 9 and 10 are formed on the cap layer 8. The source/drain electrodes 9 and 10 comprise Ti/Pt/Au to form ohmic contacts. A gate electrode 12 is formed within the recessed portion 11 and on the Schottky layer 7, wherein the gate electrode 12 is spaced apart from the cap layer 8.

FIG. 2A is illustrative of a conduction band edge profile across source/drain electrodes to a buffer layer of the above novel high electron mobility transistor. FIG. 2B is illustrative of a conduction band edge profile across a gate electrode to a buffer layer of the above novel high electron mobility transistor. The channel layer 3 provides a large quantum well which is able to confine a two-dimensional electron gas. The amount of the two-dimensional electron gas confined in the channel layer 3 is controlled by applying a control voltage signal to the gate electrode 12. A Schottky barrier with a sufficient height is formed at an interface between the gate electrode 12 and the Schottky layer 7 as illustrated in FIG. 2B. A potential barrier with a small height and a small thickness is formed at the interface between the source/drain electrodes 9 and 10 and the cap layer 8. As a result, electrons may tunnel across the potential barrier. The quantum well layer 6 provides a quantum well. This quantum well has different energy levels between under the source/drain electrodes 9 and 10 and under the gate electrode 12. Under the source/drain electrodes 9 and 10 the quantum well has the bottom positioned below the Fermi level. This means that the quantum well under the source/drain electrodes 9 and 10 has discontinuous energy levels at which electrons are allowed to exist. The Schottky layer 7 provides a potential barrier projecting above the Fermi level. The cap layer 8 has a conduction band edge profile where the conduction band edge lies below the Fermi level in the vicinity of the interface with the Schottky layer. The donor layer 3 provides a potential barrier projecting above the Fermi level, however, which is lower than the potential barrier of the Schottky layer 7. The channel layer 3 provides a sufficiently wide quantum well for confining the two-dimensional electron gas. The bottom of the wide quantum well of the channel layer 3 is sloped down toward the donor layer 5. The weight center of the two-dimensional electron gas is somewhat closed to the donor layer 5. The bottom of the narrow quantum well of the quantum well layer 6 is varied by varying the ratio of composition of In, or the index "X". If the compositional ratio of In is increased, then the conduction band edge is dropped. This means that the bottom of the narrow quantum well is lowered.

The cap layer 8 has a thickness of 50 nanometers. The Schottky layer 7 has a thickness of 5 nanometers. The donor layer 5 has a thickness of 20 nanometers. The impurity concentration of the donor layer 5 is $2.5 \times 10^{18}$ cm$^{-3}$. The single quantum well layer 6 has a thickness of 5 nanometers. The index "x" is 0.53. If the width of the potential barrier of each of the Schottky layer 7 and the donor layer 5 is not more than approximately 50 nanometers, electrons can show a tunneling across the potential barrier. In this embodiment, the width of the Schottky layer is set at 5 nanometers which is sufficiently thin for allowing electrons to show the tunneling across the Schottky layer 7. The donor layer 5 is doped with the impurity such as Si so that the conduction band edge is curved to drop the center the intermediate point to the Fermi level. This curved profile of the conduction band edge of the donor layer 5 facilitates the electron tunneling across the potential barrier constituted by the donor layer 5. The width of the potential barrier of the donor layer 5 is set at 20 nanometers and the width of the spacer layer 5 is set close to the thickness of the single quantum well layer 6.

On the other hand, under the gate electrode 12, the Schottky barrier with sufficient height and thickness to prevent electron tunneling is formed. The narrow quantum well of the single quantum well layer 6 is positioned above the Fermi level. Thus, the narrow quantum well has no energy level at which electrons are allowed to exist. For this reason, under the gate electrode, the Schottky barrier extends from the Schottky layer 7 to the donor layer 5. This Schottky barrier prevents electron tunnelings to the channel layer 3.

Variations in the materials and in the thickness of the individual layers are available provided that the conduction band edge profile is kept as illustrated in FIGS. 2A and 2B. For example, undoped GaAs is available for the channel layer 3. An impurity doped InAlAs, an impurity doped InAlSb, and an impurity doped InGaSb are also available for the donor layer 5. Undoped GaAs, and undoped InGaP are also available for the single quantum well layer 6. Undoped InAlAs, undoped InAlSb and undoped InGaSb are also available for the Schottky layer. The source/drain electrodes may be made of WSi or Mo. The compositional ratio or the index "x" of In in the single quantum well layer 6 is variable to match various conditions and design requirements.

Whereas modifications of the present invention will be apparent to a person having ordinary skill in the art, to which the invention pertains, it is to be understood that embodiments shown and described by way of illustrations are by no means intended to be considered in a limiting sense accordingly, it is to be intended to cover by claims all modifications which fall within the sprite and scope of the invention.

What is claimed is:

1. A semiconductor multi-layer structure comprising:
   a channel layer made of a first compound semiconductor having a first conduction band edge level, said channel layer being doped with an impurity and having a first thickness sufficient for confining a two-dimensional electron gas;
   a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a single quantum well layer overlying said donor layer, said quantum well layer being made of a third compound semiconductor having a third conduction band edge level lower than said second conduction band edge level, said single quantum well layer being sufficiently thin for preventing any formation of a two-dimensional electron gas;

a Schottky barrier layer overlying said single quantum well layer, said Schottky barrier layer being made of a fourth compound semiconductor having a fourth conduction band edge level higher than said third conduction band edge level, said Schottky barrier layer being sufficiently thin for allowing electrons to show a tunneling across said Schottky barrier layer; and a cap layer overlying said Schottky barrier layer, said cap layer being made of a fifth compound semiconductor having a fifth conduction band edge level lower than said fourth conduction band edge level, said cap layer being doped with an impurity, so that when a bias is applied between said channel layer and said cap layer, electrons move between said channel layer and said cap layer via tunnelings across said Schottky barrier layer and across said donor layer.

2. The structure as claimed in claim 1, wherein said donor layer has a thickness not more than 500 angstroms.

3. The structure as claimed in claim 1, wherein said Shottky barrier layer has a thickness not more than 500 angstroms.

4. The structure as claimed in claim 1, wherein said single quantum well layer has a thickness not more than 150 angstroms.

5. The structure as claimed in claim 1, wherein said first compound semiconductor is one selected from the group consisting of InGaAs and GaAs.

6. The structure as claimed in claim 1, wherein said second compound semiconductor is one selected from the group consisting of InAlAs and InGaP.

7. The structure as claimed in claim 1, wherein said second compound semiconductor is one selected from the group consisting of AlGaAs, InAlAs, InAlSb and InGaSb.

8. The structure as claimed in claim 1, wherein said third compound semiconductor is one selected from the group consisting of InGaAs, GaAs, InP, InGaP, InGaSb, and InAlSbP.

9. The structure as claimed in claim 8, wherein said fourth compound semiconductor is one selected from the group consisting of InAlAs and AlGaAs.

10. The structure as claimed in claim 1, wherein said fifth compound semiconductor is one selected from the group consisting of InGaAs, GaAs and InAs.

11. A semiconductor multi-layer structure comprising:

a channel layer made of a first compound semiconductor having a first conduction band edge level, said channel layer being doped with an impurity and having a first thickness sufficient for confining a two-dimensional electron gas;

a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a multiple-quantum well layer structure overlying said donor layer, said multiple-quantum well layer structure comprising at least two quantum well layers and at least one potential barrier layer sandwiched between said quantum well layers, said potential barrier layer being made of said second compound semiconductor, said quantum well layers being made of a third compound semiconductor having a third conduction band edge level lower than said second conduction band edge level, each of said quantum well layers being sufficiently thin for preventing any formation of a two-dimensional electron gas, and said potential barrier layer being sufficiently thin for allowing electrons to show a tunneling across said potential barrier layer;

a Schottky barrier layer overlying the top one of said quantum well layers, said Schottky barrier layer being made of a fourth compound semiconductor having a fourth conduction band edge level higher than said third conduction band edge level, said Schottky barrier layer being sufficiently thin for allowing electrons to show a tunneling across said Schottky barrier layer; and a cap layer overlying said Schottky barrier layer, said cap layer being made of a fifth compound semiconductor having a fifth conduction band edge level lower than said fourth conduction band edge level, so that when a bias is applied between said channel layer and said cap layer, electrons move between said channel layer and said cap layer via tunnelings across said Schottky barrier layer, across said donor layer and across said potential barrier layer.

12. The structure as claimed in claim 11, wherein said donor layer has a thickness not more than 500 angstroms.

13. The structure as claimed in claim 11, wherein said Shottky barrier layer has a thickness not more than 500 angstroms.

14. The structure as claimed in claim 11, wherein said potential barrier layer has a thickness not more than 500 angstroms.

15. The structure as claimed in claim 11, wherein each of said quantum well layers has a thickness not more than 150 angstroms.

16. The structure as claimed in claim 11, wherein said first compound semiconductor is one selected from the group consisting of InGaAs and GaAs.

17. The structure as claimed in claim 11, wherein said second compound semiconductor is one selected from the group consisting of InAlAs and InGaP.

18. The structure as claimed in claim 11, wherein said second compound semiconductor is one selected from the group consisting of AlGaAs, InAlAs, InAlSb and InGaSb.

19. The structure as claimed in claim 11, wherein said third compound semiconductor is one selected from the group consisting of InGaAs, GaAs, InP, InGaP, InGaSb, and InAlSbP.

20. The structure as claimed in claim 19, wherein said fourth compound semiconductor is one selected from the group consisting of InAlAs and AlGaAs.

21. The structure as claimed in claim 11, wherein said fifth compound semiconductor is one selected from the group consisting of InGaAs, GaAs and InAs.

22. A high electron mobility field effect transistor comprising:

a channel layer overlying a semiconductor substrate, said channel layer being made of a first compound semiconductor having a first conduction band edge level, said channel layer being doped with an impurity and having a first thickness sufficient for confining a two-dimensional electron gas;

a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a single quantum well layer overlying said donor layer, said quantum well layer being made of a third compound semiconductor having a third conduction band edge level lower than said second conduction band edge level, said single quantum well layer being sufficiently thin for preventing any formation of a two-dimensional electron gas;

a Schottky barrier layer overlying said single quantum well layer, said Schottky barrier layer being made of a fourth compound semiconductor having a fourth conduction band edge level higher than said third conduction band edge level, said Schottky barrier layer being sufficiently thin for allowing electrons to show a tunneling across said Schottky barrier layer; and a cap layer with a recessed portion overlying said Schottky barrier layer, said cap layer being made of a fifth compound semiconductor having a fifth conduction band edge level lower than said fourth conduction band edge level, said cap layer being doped with an impurity, a Schottky gate electrode provided in said recessed portion of said cap layer so as to be spaced apart from said cap layer; and source/drain electrodes provided on said cap layer, so that when a bias is applied between said source/drain electrodes, electrons move between said channel layer and said cap layer via tunnelings across said Schottky barrier layer and across said donor layer.

23. The transistor as claimed in claim 22, wherein said donor layer has a thickness not more than 500 angstroms.

24. The transistor as claimed in claim 22, wherein said Shottky barrier layer has a thickness not more than 500 angstroms.

25. The transistor as claimed in claim 22, wherein said single quantum well layer has a thickness not more than 150 angstroms.

26. The transistor as claimed in claim 22, wherein said first compound semiconductor is one selected from the group consisting of InGaAs and GaAs.

27. The transistor as claimed in claim 22, wherein said second compound semiconductor is one selected from the group consisting of InAlAs and InGaP.

28. The transistor as claimed in claim 22, wherein said second compound semiconductor is one selected from the group consisting of AlGaAs, InAlAs, InAlSb and InGaSb.

29. The transistor as claimed in claim 22, wherein said third compound semiconductor is one selected from the group consisting of InGaAs, GaAs, InP, InGaP, InGaSb, and InAlSbP.

30. The transistor as claimed in claim 29, wherein said fourth compound semiconductor is one selected from the group consisting of InAlAs and AlGaAs.

31. The transistor as claimed in claim 22, wherein said fifth compound semiconductor is one selected from them group consisting of InGaAs, GaAs and InAs.

32. The transistor as claimed in claim 22, further comprising a buffer layer between said semiconductor substrate and said channel layer, said buffer layer being made of a sixth compound semiconductor having a sixth conduction band edge level higher than said first conduction band edge level.

33. The transistor as claimed in claim 32, wherein said sixth compound semiconductor is one selected from the group consisting of i-InAlAs and i-InP.

34. The transistor as claimed in claim 22, further comprising an additional donor layer between said semiconductor substrate and said channel layer, said additional donor layer being made of a seventh compound semiconductor having a seventh conduction band edge level higher than said first conduction band edge level, and said additional donor layer being doped with an impurity.

35. The transistor as claimed in claim 22, wherein said source/drain electrodes are made of Ti/Pt/Au.

36. The transistor as claimed in claim 22, wherein said source/drain electrodes are made of WSi.

37. The transistor as claimed in claim 22, wherein said source/drain electrodes are made of Mo.

38. A high electron mobility field effect transistor comprising:

a channel layer overlying a semiconductor substrate, said channel layer being made of a first compound semiconductor having a first conduction band edge level, said channel layer being doped with an impurity and having a first thickness sufficient for confining a two-dimensional electron gas;

a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a multiple-quantum well layer structure overlying said donor layer, said multiple-quantum well layer structure comprising at least two quantum well layers and at least one potential barrier layer sandwiched between said quantum well layers, said potential barrier layer being made of said second compound semiconductor, said quantum well layers being made of a third compound semiconductor having a third conduction band edge level lower than said second conduction band edge level, each of said quantum well layers being sufficiently thin for preventing any formation of a two-dimensional electron gas, and said potential barrier layer being sufficiently thin for allowing electrons to show a tunneling across said potential barrier layer;

a Schottky barrier layer overlying the top one of said quantum well layers, said Schottky barrier layer being made of a fourth compound semiconductor having a fourth conduction band edge level higher than said third conduction band edge level, said Schottky barrier layer being sufficiently thin for allowing electrons to show a tunneling across said Schottky barrier layer;

a cap layer overlying said Schottky barrier layer, said cap layer being made of a fifth compound semiconductor having a fifth conduction band edge level lower than said fourth conduction band edge level;

a Schottky gate electrode provided in said recessed portion of said cap layer so as to be spaced apart from said cap layer; and source/drain electrodes provided on said cap layer, so that when a bias is applied between said channel layer and said cap layer, electrons move between said channel layer and said cap layer via tunnelings across said Schottky barrier layer, across said donor layer and across said potential barrier layer.

39. The transistor as claimed in claim 38, wherein said donor layer has a thickness not more than 500 angstroms.

40. The transistor as claimed in claim 38, wherein said Shottky barrier layer has a thickness not more than 500 angstroms.

41. The transistor as claimed in claim 38, wherein said potential barrier layer has a thickness not more than 500 angstroms.

42. The transistor as claimed in claim 38, wherein each of said quantum well layers has a thickness not more than 150 angstroms.

43. The transistor as claimed in claim 38, wherein said first compound semiconductor is one selected from the group consisting of InGaAs and GaAs.

44. The transistor as claimed in claim 38, wherein said second compound semiconductor is one selected from the group consisting of InAlAs and InGaP.

45. The transistor as claimed in claim 38, wherein said second compound semiconductor is one selected from the group consisting of AlGaAs, InAlAs, InAlSb and InGaSb.

46. The transistor as claimed in claim 38, wherein said third compound semiconductor is one selected from the group consisting of InGaAs, GaAs, InP, InGaP, InGaSb, and InAlSbP.

47. The transistor as claimed in claim 46, wherein said fourth compound semiconductor is one selected from the group consisting of InAlAs and AlGaAs.

48. The transistor as claimed in claim 38, wherein said fifth compound semiconductor is one selected from the group consisting of InGaAs, GaAs and InAs.

49. The transistor as claimed in claim 38, further comprising a buffer layer between said semiconductor substrate and said channel layer, said buffer layer being made of a sixth compound semiconductor having a sixth conduction band edge level higher than said first conduction band edge level.

50. The transistor as claimed in claim 49, wherein said sixth compound semiconductor is one selected from the group consisting of i-InAlAs and i-InP.

51. The transistor as claimed in claim 38, further comprising an additional donor layer between said semiconductor substrate and said channel layer, said additional donor layer being made of a seventh compound semiconductor having a seventh conduction band edge level higher than said first conduction band edge level, and said additional donor layer being doped with an impurity.

52. The transistor as claimed in claim 38, wherein said source/drain electrodes are made of Ti/Pt/Au.

53. The transistor as claimed in claim 38, wherein said source/drain electrodes are made of WSi.

54. The transistor as claimed in claim 38, wherein said source/drain electrodes are made of Mo.

55. A semiconductor multi-layer structure comprising:
a channel layer made of a first compound semiconductor having a first conduction band edge level, said channel layer being doped with an impurity and having a first thickness sufficient for confining a two-dimensional electron gas;
a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a single quantum well layer overlying said donor layer, said quantum well layer being made of a third compound semiconductor having a third conduction band edge level lower than said second conduction band edge level, said single quantum well layer being sufficiently thin for preventing any formation of a two-dimensional electron gas;

a Schottky barrier layer overlying said single quantum well layer, said Schottky barrier layer being made of a fourth compound semiconductor having a fourth conduction band edge level higher than said third conduction band edge level, said Schottky barrier layer being undoped, and said Schottky barrier layer being sufficiently thin for allowing electrons to show a tunneling across said Schottky barrier layer; and a cap layer overlying said Schottky barrier layer, said cap layer being made of a fifth compound semiconductor having a fifth conduction band edge level lower than said fourth conduction band edge level, said cap layer being doped with an impurity, so that when a bias is applied between said channel layer and said cap layer, electrons move between said channel layer and said cap layer via tunnelings across said Schottky barrier layer and across said donor layer, wherein said fourth compound semiconductor has an electron affinity which is substantially equal to that of said second compound semiconductor so that a conduction band edge profile of said Schottky barrier layer is substantially aligned on a straight line which extends from a conduction band edge profile of said donor layer in the vicinity of an interface between said single quantum well layer and said donor layer.

56. The structure as claimed in claim 55,
wherein said donor layer has a thickness not more than 500 angstroms,
wherein said Schottky barrier layer has a thickness not more than 500 angstroms, and
wherein said single quantum well layer has a thickness not more than 150 angstroms.

57. The structure as claimed in claim 55,
wherein said first compound semiconductor is one selected from the group consisting of InGaAs, GaAs,
wherein said second compound semiconductor is one selected from the group consisting of InAlAs, InGaP, AlGaAs, InAlSb and InGaSb,
wherein said third compound semiconductor is one selected from the group consisting of InGaAs, GaAs, InP, InGaP, InGaSb, and InAlSbP,
wherein said fourth compound semiconductor is one selected from the group consisting of InAlAs and AlGaAs, and
wherein said fifth compound semiconductor is one selected from the group consisting of InGaAs, GaAs and InAs.

58. A semiconductor multi-layer structure comprising:
a channel layer made of a first compound semiconductor having a first conduction band edge level, said channel layer being doped with an impurity and having a first thickness sufficient for confining a two-dimensional electron gas;
a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a multiple-quantum well layer structure overlying said donor layer, said multiple-quantum well layer structure comprising at least two quantum well layers and at least one potential barrier layer sandwiched between said quantum well layers, said potential barrier layer being made of said second compound semiconductor, said quantum well layers being made of a third compound semiconductor having a third conduction band edge level lower than said second conduction band edge level, each of said quantum well layers being sufficiently thin for preventing any formation of a two-dimensional electron gas, and said potential barrier layer being sufficiently thin for allowing electrons to show a tunneling across said potential barrier layer;

a Schottky barrier layer overlying the top one of said quantum well layers said Schottky barrier layer being made of a fourth compound semiconductor having a fourth conduction band edge level higher than said third conduction band edge level, said Schottky barrier layer being undoped, and said Schottky barrier layer being sufficiently thin for allowing electrons to show a tunneling across said Schottky barrier layer; and a cap layer overlying said Schottky barrier layer, said cap layer being made of a fifth compound semiconductor having a fifth conduction band edge level lower than said fourth conduction band edge level, so that when a bias is applied between said channel layer and said cap layer, electrons move between said channel layer and said cap layer via tunnelings across said Schottky barrier layer, across said donor layer and across said potential barrier layer, wherein said fourth compound semiconductor has an electron affinity which is substantially equal to that of said second compound semiconductor so that a conduction band edge profile of said Schottky barrier layer is substantially aligned on a straight line which extends from a conduction band edge profile of said donor layer in the vicinity of an interface between said multiple-quantum well layer structure and said donor layer.

59. The structure as claimed in claim 58, wherein said donor layer has a thickness not more than 500 angstroms, wherein said Schottky barrier layer has a thickness not more than 500 angstroms, wherein said potential barrier layer has a thickness not more than 500 angstroms, and wherein each of said quantum well layers has a thickness not more than 150 angstroms.

60. The structure as claimed in claim 58, wherein said first compound semiconductor is one selected from the group consisting of InGaAs and GaAs, wherein said second compound semiconductor is one selected from the group consisting of InAlAs, InGaP, AlGaAs, InAlSb and InGaSb, wherein said third compound semiconductor is one selected from the group consisting of InGaAs, GaAs, InP, InGaP, InGaSb, and InAlSbP, wherein said fourth compound semiconductor is one selected from the group consisting of InAlAs and AlGaAs, and wherein said fifth compound semiconductor is one selected from the group of InGaAs, GaAs and InAs.

61. A high electron mobility field effect transistor comprising:

a channel layer overlying a semiconductor substrate, said channel layer being made of a first compound semiconductor having a first conduction band edge level, said channel layer being doped with an impurity and having a first thickness sufficient for confining a two-dimensional electron gas;

a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a single quantum well layer overlying said donor layer; said quantum well layer being made of a third compound semiconductor having a third conduction band edge level lower than said second conduction band edge level, said single quantum well layer being sufficiently thin for preventing any formation of a two-dimensional electron gas;

a Schottky barrier layer overlying said single quantum well layer, said Schottky barrier layer being made of a fourth compound semiconductor having a fourth conduction band edge level higher than said third conduction band edge level, said Schottky barrier layer being undoped, and said Schottky barrier layer being sufficiently thin for allowing electrons to show a tunneling across said Schottky barrier layer; and a cap layer with a recessed portion overlying said Schottky barrier layer, said cap layer being made of a fifth compound semiconductor having a fifth conduction band edge level lower than said fourth conduction band edge level, said cap layer being doped with an impurity, a Schottky gate electrode provided in said recessed portion of said cap layer so as to be spaced apart from said cap layer; and source/drain electrodes provided on said cap layer, so that when a bias is applied between said source/drain electrodes, electrons move between said channel layer and said cap layer via tunnelings across said Schottky barrier layer and across said donor layer, wherein said fourth compound semiconductor has an electron affinity which is substantially equal to that of said second compound semiconductor so that a conduction band edge profile of said Schottky barrier layer is substantially aligned on a straight line which extends from a conduction band edge profile of said donor layer in the vicinity of an interface between said single quantum well layer and said donor layer.

62. The transistor as claimed in claim 61, wherein said donor layer has a thickness not more than 500 angstroms, wherein said Schottky barrier layer has a thickness not more than 500 angstroms, and wherein said single quantum well layer has a thickness not more than 150 angstroms.

63. The transistor as claimed in claim 61, wherein said first compound semiconductor is one selected from the group consisting of InGaAs and GaAs, wherein said second compound semiconductor is one selected from the group consisting of InAlAs, InGaP, AlGaAs, InAlSb and InGaSb, wherein said third compound semiconductor is one selected from the group consisting of InGaAs, GaAs, InP, InGaP, InGaSb, and InAlSbP, wherein said fourth compound semiconductor is one selected from the group consisting of InAlAs and AlGaAs, and wherein said fifth compound semiconductor is one selected from the group consisting of InGaAs, GaAs and InAs.

64. The transistor as claimed in claim 55, further comprising a buffer layer between said semiconductor substrate and said channel layer, said buffer layer being made of a sixth compound semiconductor having a sixth conduction band edge level higher than said first conduction band edge level.

65. The transistor as claimed in claim 64, wherein said sixth compound semiconductor is one selected from the group consisting of i-InAlAs and i-InP.

66. The transistor as claimed in claim 61, further comprising an additional donor layer between said semiconductor substrate and said channel layer, said additional donor layer being made of a seventh compound semiconductor having a seventh conduction band edge level higher than said first conduction band edge level, and said additional donor layer being doped with an impurity.

67. The transistor as claimed in claim 22, wherein said source/drain electrodes are made of one selected from the group consisting of Ti/Pt/Au, Wsi and Mo.

68. A high electron mobility field effect transistor comprising:

a channel layer overlying a semiconductor substrate, said channel layer being made of a first compound semiconductor having a first conduction band edge level, said channel layer being doped with an impurity and having a first thickness sufficient for confining a two-dimensional electron gas;

a donor layer overlying said channel layer, said donor layer being made of a second compound semiconductor having a second conduction band edge level higher than said first conduction band edge level, said donor layer being doped with an impurity, said donor layer being sufficiently thin for allowing electrons to show a tunneling across said donor layer;

a multiple-quantum well layer structure overlying said donor layer, said multiple-quantum well layer structure comprising at least two quantum well layers and at least one potential barrier layer sandwiched between said quantum well layers, said potential barrier layer being made of said second compound semiconductor, said quantum well layers being made of a third compound semiconductor having a third conduction band edge level lower than said second conduction band edge level, each of said quantum well layers being sufficiently thin for preventing any formation of a two-dimensional electron gas, and said potential barrier layer being sufficiently thin for allowing electrons to show a tunneling across said potential barrier layer;

a Schottky barrier layer overlying the top one of said quantum well layers, said Schottky barrier layer being made of a fourth compound semiconductor having a fourth conduction band edge level higher than said third conduction band edge level, said Schottky barrier layer being undoped, and said Schottky barrier layer being sufficiently thin for allowing electrons to show a tunneling across said Schottky barrier layer;

a cap layer overlying said Schottky barrier layer, said cap layer being made of a fifth compound semiconductor having a fifth conduction band edge level lower than said fourth conduction band edge level;

a Schottky gate electrode provided in said recessed portion of said cap layer so as to be spaced apart from said cap layer; and source/drain electrodes provided on said cap layer, so that when a bias is applied between said channel layer and said cap layer, electrons move between said channel layer and said cap layer via tunnelings across said Schottky barrier layer, across said donor layer and across said potential barrier layer, wherein said fourth compound semiconductor has an electron affinity which is substantially equal to that of said second compound semiconductor so that a conduction band edge profile of said Schottky barrier layer is substantially aligned on a straight line which extends from a conduction band edge profile of said donor layer in the vicinity of an interface between said multiple-quantum well layer structure and said donor layer.

69. The transistor as claimed in claim 68, wherein said donor layer has a thickness not more than 500 angstroms, wherein said Schottky barrier layer has a thickness not more than 500 angstroms, wherein said potential barrier layer has a thickness not more than 500 angstroms, and wherein each of said quantum well layers has a thickness not more than 150 angstroms.

70. The transistor as claimed in claim 68, wherein said first compound semiconductor is one selected from the group consisting of InGaAs and GaAs, wherein said second compound semiconductor is one selected from the group consisting of InAlAs, InGaP, AlGaAs, InAlSb and InGaSb, wherein said third compound semiconductor is one selected from the group consisting of InGaAs, GaAs, InP, InGaP, InGaSb, and InAlSbP, wherein said fourth compound semiconductor is one selected from the group consisting of InAlAs and AlGaAs, and wherein said fifth compound semiconductor is one selected from the group consisting of InGaAs, GaAs and InAs.

71. The transistor as claimed in claim 68, further comprising a buffer layer between said semiconductor substrate and said channel layer, said buffer layer being made of a sixth compound semiconductor having a sixth conduction band edge level higher than said first conduction band edge level.

72. The transistor as claimed in claim 71, wherein said sixth compound semiconductor is one selected from the group consisting of i-InAlAs and i-InP.

73. The transistor as claimed in claim 68, further comprising an additional donor layer between said semiconductor substrate and said channel layer, said additional donor layer being made of a seventh compound semiconductor having a seventh conduction band edge level higher than said first conduction band edge level, and said additional donor layer being doped with an impurity.

74. The transistor as claimed in claim 68, wherein said source/drain electrodes are made of one selected from the group consisting of Ti/Pt/Au, Wsi and Mo.

* * * * *